(12) United States Patent
Dai et al.

(10) Patent No.: US 10,622,348 B2
(45) Date of Patent: Apr. 14, 2020

(54) PROTECTION DEVICE AND METHOD FOR FABRICATING THE PROTECTION DEVICE

(71) Applicant: United Microelectronics Corp., Hsinchu (TW)

(72) Inventors: Sheng-Huei Dai, Taitung County (TW); Tzung-Lin Li, Hsinchu (TW)

(73) Assignee: UNITED MICROELECTRONICS CORP., Hsinchu (TW)

(*) Notice: Subject to any disclaimer, the term of this patent is extended or adjusted under 35 U.S.C. 154(b) by 0 days.

(21) Appl. No.: 16/248,615

(22) Filed: Jan. 15, 2019

(65) Prior Publication Data

US 2019/0148356 A1  May 16, 2019

Related U.S. Application Data

(62) Division of application No. 15/621,772, filed on Jun. 13, 2017, now Pat. No. 10,262,986.

(51) Int. Cl.
*H01L 27/02* (2006.01)
*H01L 29/66* (2006.01)
(Continued)

(52) U.S. Cl.
CPC ...... *H01L 27/0255* (2013.01); *H01L 27/0288* (2013.01); *H01L 29/66136* (2013.01);
(Continued)

(58) Field of Classification Search
CPC . H01L 27/02; H01L 27/0255; H01L 27/0288; H01L 27/0251; H01L 27/0248; H01L 27/0292; H01L 27/0259; H01L 27/0262; H01L 27/0266; H01L 27/0296; H01L 27/0277; H01L 29/06; H01L 29/0692; H01L 29/0649; H01L 29/0615; H01L 29/74; H01L 29/747; H01L 29/7436; H01L 29/08; H01L 29/0804; H01L 29/0821; H01L 29/0847; H01L 29/66; H01L 29/66136; H01L 29/66174; H01L 29/66121; H01L 29/861; H01L 29/93; H01L 29/94

(Continued)

(56) References Cited

U.S. PATENT DOCUMENTS 5,581,103 A    12/1996  Mizukami
6,399,990 B1*  6/2002   Brennan ............. H01L 27/0266
                                                       257/355

(Continued)

OTHER PUBLICATIONS

Sheng-Huei Dai, et al., "Lateral Back-to-Back Diode for Low-Capacitance Transient Voltage Suppressor," Japanese Journal of Applied Physics, vol. 49, Apr. 20, 2010, pp. 04DP13-1-04DP13-4.

Primary Examiner — Chuong A Luu
(74) Attorney, Agent, or Firm — J.C. Patents

(57) ABSTRACT

A method for fabricating a protection device includes forming a doped well with a first-type impurity in a substrate. A first semiconductor terminal with a second-type impurity is formed on the doped well. A second semiconductor terminal with a second-type impurity is formed on the doped well separating from the first semiconductor terminal. The first semiconductor terminal is connected to a voltage level and a second semiconductor terminal is connected to a ground voltage.

16 Claims, 5 Drawing Sheets

(51) Int. Cl.
   *H01L 29/861*    (2006.01)
   *H01L 29/93*     (2006.01)
   H01L 29/06       (2006.01)
   H01L 29/94       (2006.01)

(52) U.S. Cl.
   CPC ...... *H01L 29/66174* (2013.01); *H01L 29/861* (2013.01); *H01L 29/93* (2013.01); H01L 29/0692 (2013.01); H01L 29/66121 (2013.01); H01L 29/94 (2013.01)

(58) Field of Classification Search
   USPC .......................................... 257/356; 438/309
   See application file for complete search history.

(56) References Cited

U.S. PATENT DOCUMENTS

| | | |
|---|---|---|
| 7,582,916 B2 | 9/2009 | Ker et al. |
| 7,626,243 B2 | 12/2009 | Disney et al. |
| 2002/0130390 A1 | 9/2002 | Ker et al. |
| 2006/0119451 A1 | 6/2006 | Chen |
| 2019/0156890 A1* | 5/2019 | Widjaja ................ G11C 11/404 |
| 2019/0165045 A1* | 5/2019 | Chung ................ H01L 27/2454 |

* cited by examiner

PROTECTION DEVICE AND METHOD FOR FABRICATING THE PROTECTION DEVICE

CROSS-REFERENCE TO RELATED APPLICATION

This application is a divisional application of and claims the priority benefit of U.S. application Ser. No. 15/621,772, filed on Jun. 13, 2017, now allowed. The entirety of the above-mentioned patent application is hereby incorporated by reference herein and made a part of this specification.

BACKGROUND

1. Field of the Invention

The present invention generally relates to semiconductor fabrication, and particularly to a protection device and a method for fabricating the protection device.

2. Description of Related Art

The circuit of electronic device is usually fabricated by semiconductor fabrication technology to form an integrated circuit. Various components of the semiconductor device need to be formed over a substrate, such as silicon wafer. During fabrication, the semiconductor device as currently fabricated in any stage usually needs to be tested to assure the performance as designed.

In testing procedure, the semiconductor device is probed by probing apparatus, and the electronic signals as probed are led to a pad row, which has a number of pads, for connecting to the external testing apparatus. As a result, the external testing apparatus can connect with the semiconductor device through the pads for measurement or any testing operation.

In order to protect the semiconductor devices as under tested from unexpected high voltage or large current, such electrostatic voltage/current, the pad is usually connected with a protection diode. So, when the high voltage has accidently occurred, the protection diode may break down and lead the current/voltage to the ground, without entering the semiconductor device.

The protection diode usually has a parasitic capacitor exiting at the P-N junction. This parasitic capacitor usually has a large parasitic capacitance. However, some electronic devices, such as radio-frequency (RF) device, are sensitive the capacitance. The protection diode may cause the measure shift when testing the semiconductor device.

The issue to reduce the effect caused by the parasitic capacitance from the protection diode at the pads is necessary to be considered during testing procedure.

SUMMARY OF THE INVENTION

The invention provides a protection device, connected to measuring pads, in which the parasitic capacitance can be effectively reduced.

In an embodiment, the invention provides a protection device. The protection device includes a doped well with a first-type impurity, formed in a substrate. A first semiconductor terminal with a second-type impurity is formed on the doped well. A second semiconductor terminal with a second-type impurity is formed on the doped well separating from the first semiconductor terminal. The first semiconductor terminal is connected to a voltage level and a second semiconductor terminal is connected to a ground voltage.

In an embodiment, as to the protection device, the first-type impurity is P-type impurity and the second-type impurity is N-type impurity, or the first-type impurity is N-type impurity and the second-type impurity is P-type impurity.

In an embodiment, the protection device further includes an insulating layer on the doped well to isolate the second semiconductor terminal from the first semiconductor terminal.

In an embodiment, as to the protection device, the first semiconductor terminal serves as a gate terminal connected to a device to be protected and a second semiconductor terminal serves as a ground terminal connected to a ground voltage.

In an embodiment, as to the protection device, an area of the first semiconductor terminal is larger than an area of the second semiconductor terminal.

In an embodiment, as to the protection device, the first semiconductor terminal and the second semiconductor terminal are a polygon shape with separation.

In an embodiment, as to the protection device, the polygon shape is rectangular, hexagonal, or octagonal.

In an embodiment, as to the protection device, the first semiconductor terminal surrounds the second semiconductor terminal.

In an embodiment, as to the protection device, a first junction capacitor formed between the first semiconductor terminal and the doped well, and a second junction capacitor formed between the second semiconductor terminal and the doped well.

In an embodiment, as to the protection device, the first junction capacitor is larger than the second junction capacitor.

In an embodiment, as to the protection device, the first junction capacitor is connected to the second junction capacitor in series.

In an embodiment, the invention provides a method for fabricating a protection device. The method comprises forming a doped well with a first-type impurity in a substrate. A first semiconductor terminal with a second-type impurity is formed on the doped well. A second semiconductor terminal with a second-type impurity is formed on the doped well separating from the first semiconductor terminal. The first semiconductor terminal is connected to a voltage level and a second semiconductor terminal is connected to a ground voltage.

In an embodiment, as to the method for fabricating a protection device, the first-type impurity is P-type impurity and the second-type impurity is N-type impurity, or the first-type impurity is N-type impurity and the second-type impurity is P-type impurity.

In an embodiment, the method for fabricating a protection device further comprises forming an insulating layer on the doped well to isolate the second semiconductor terminal from the first semiconductor terminal.

In an embodiment, as to the method for fabricating a protection device, an area of the first semiconductor terminal is larger than an area of the second semiconductor terminal.

In an embodiment, as to the method for fabricating a protection device, the first semiconductor terminal and the second semiconductor terminal are a polygon shape with separation.

In an embodiment, as to the method for fabricating a protection device, the first semiconductor terminal surrounds the second semiconductor terminal.

In an embodiment, as to the method for fabricating a protection device, a first junction capacitor formed between the first semiconductor terminal and the doped well, and a second junction capacitor formed between the second semiconductor terminal and the doped well.

In an embodiment, as to the method for fabricating a protection device, the first junction capacitor is larger than the second junction capacitor.

In an embodiment, as to the method for fabricating a protection device, the first junction capacitor is connected to the second junction capacitor in series.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to semiconductor device about protection device, which can at least effectively avoid an abrupt unexpected high voltage from entering the device under tested. The protection device can also have reduced parasitic capacitance and is suitable for use in test for the semiconductor device sensitive to the capacitance, such as RF transistor.

The semiconductor device after fabrication usually needs to be tested. The probing device would contact to the detection point of the semiconductor device, so to lead the electronic signals out to the connection pads, in an example. The external analysing/testing apparatus can connect to the connection pad to obtain the probed signals.

During the testing procedure, an unexpected high voltage or even the electrostatic voltage may accidently occur to the semiconductor device through the connection pad, causing a damage of the semiconductor device as to be tested. So, the protection device, such as protection diode, is usually connected to the connection pad to avoid the unexpected high voltage to enter the semiconductor device.

However, the protection diode usually has a large parasitic capacitance. The parasitic capacitance may cause large deviation of measurement for the semiconductor device, which is sensitive to the capacitance, such as the RF metal-oxide-semiconductor field effect transistor (RFMOSFET) device.

The invention has proposed a structure of the protection device at the connection pad. The parasitic capacitance can be reduced. In addition, the protection effect can also be improved.

Figure 1:
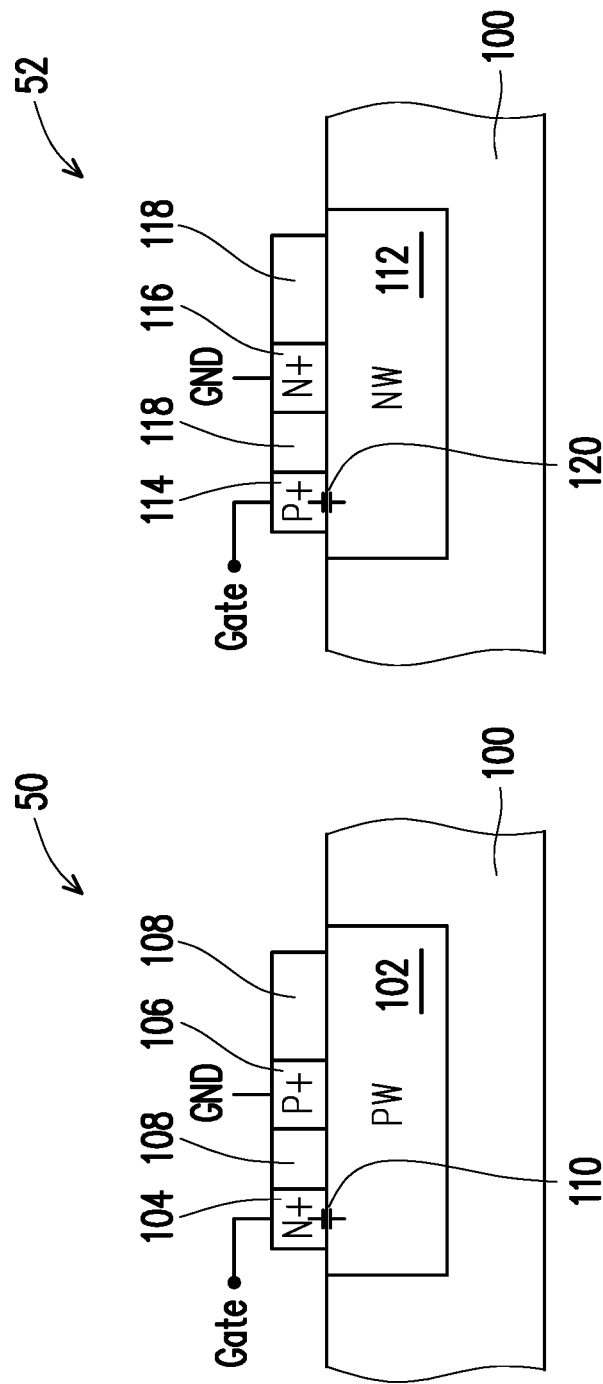
FIG. 1 is a drawing, schematically illustrating a cross-sectional view of a protection diode, according to an embodiment of the invention.

Before proposing the protection device, the invention has looked into the structure of the protection diode taken in testing procedure for connection to the connection pads. FIG. 1 is a drawing, schematically illustrating a cross-sectional view of a protection diode, according to an embodiment of the invention.

Referring to FIG. 1, the protection device usually is a NP protection diode 50 or a PN diode 52 in different type for different conductive type. At to the NP protection diode 50, a P-type doped well (PW) 102 is formed in a substrate 100. A N+ doped layer 104 and a P+ doped layer 106 are formed on the P-type doped well (PW) 102. The insulating layer 108 can also be formed on the P-type doped well (PW) 102 for insulating the N+ doped layer 104 and a P+ doped layer 106. In operation, the N+ doped layer 104 is connected to the voltage level, as indicated by Gate. The P+ doped layer 106 is connection to the ground voltage indicated by GND. As a result, a NP diode can be formed in the path of the N+ doped layer 104, the P-type doped well (PW) 102, and the P+ doped layer 106.

Likewise, the protection diode 52 is for protecting the other semiconductor device in another conductive type. So, the N-type doped well (NW) 112 is formed in the substrate 100. The P+ doped layer 114 and the N+ doped layer 116 are formed on the N-type doped well (NW) 112. The insulating layer 118 is also formed on the N-type doped well (NW) 112 for insulating the P+ doped layer 114 and the N+ doped layer 116. The P+ doped layer 114 is connected to the voltage level, as indicated by Gate, and the N+ doped layer 116 is connected to the ground voltage, as indicated by GND. The parasitic capacitor 120 is created at the P-N junction between the P+ doped layer 114 and the N+ doped layer 116.

Figure 2:
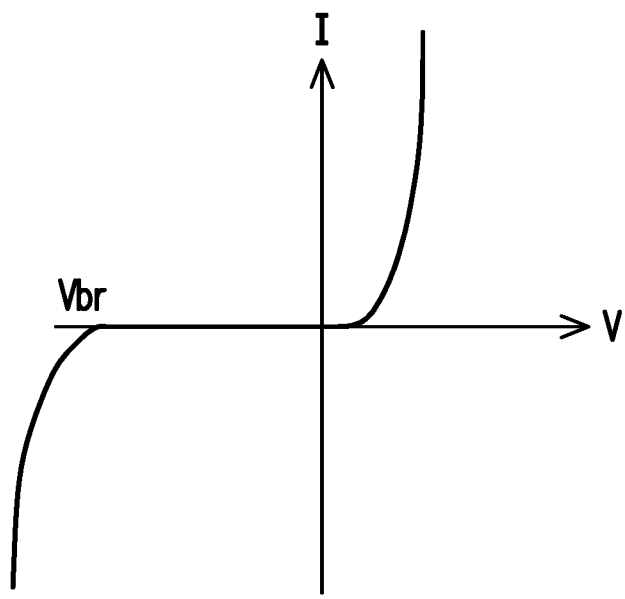
FIG. 2 is a drawing, schematically illustrating a I-V curve of the protection diode in FIG. 1, according to an embodiment of the invention.

In electric protection effect, the protection diode can induce a large current when the voltage is out of the working voltage range. FIG. 2 is a drawing, schematically illustrating a I-V curve of the protection diode in FIG. 1, according to an embodiment of the invention. Referring to FIG. 2, in an example, when an unexpected voltage is applied to the connection pad, the protection diode is hen entering a state with large current. In an example, if the negative voltage is applied to the connection pad, and is accidently larger than the Vbr, then the protection diode 50 would lead the unexpected voltage away with large current, as known as the breakdown of diode.

However, it can be noted that a parasitic capacitor 110, 120 exists at the N-P junction or the P-N junction. The parasitic capacitor 110, 120 would produce the parasitic capacitance at the level not being ignorable. The parasitic capacitor 110 may cause the measurement deviation when the signals is sensitive to the capacitance, such as resistance-capacitance (RC) effect.

The invention has looked into this issue and found that the deviation caused by the capacitance effect of the parasitic capacitor is not ignorable. The invention then proposes a structure of the protection device.

Several embodiments are provided for description of the invention but not for limiting the invention.

Figure 3:
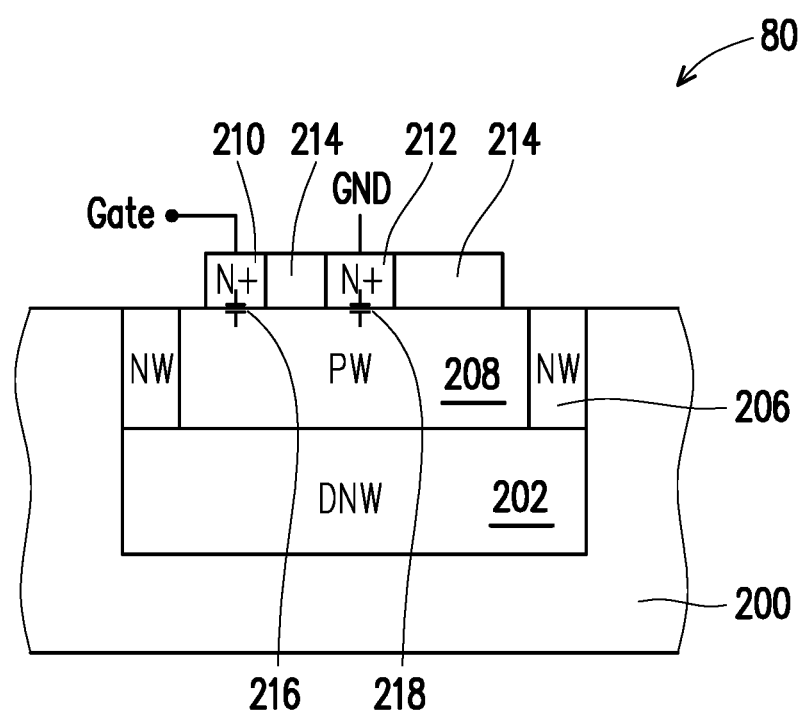
FIG. 3 is a drawing, schematically illustrating a cross-sectional view of a protection device, according to an embodiment of the invention.

FIG. 3 is a drawing, schematically illustrating a cross-sectional view of a protection device, according to an embodiment of the invention. Referring to FIG. 3, a protection device 80 is formed on the substrate 200. The substrate 200 may have several doped regions such as deep N-type doped well (DNW) 202, N-type doped well (NW)

206 and P-type doped well (PW) 208, but the invention is not limited to these doped regions. In an embodiment, the protection device 80 is formed on the P-type doped well (PW) 208. The N+ doped layer 210, serving as the first semiconductor terminal, is formed on the substrate 200 over the P-type doped well (PW) 208. Another N+ doped layer 212, serving as the second semiconductor terminal, is formed on the substrate 200 over the P-type doped well (PW) 208. The N+ doped layer 210 and the N+ doped layer 212 are insulated by the insulating layer 214 on the P-type doped well (PW) 208. As a result, the protection device 80 includes the N+ doped layer 210, the P-type doped well (PW) 208, and the N+ doped layer 212 to form a N-P-N structure, which can be considered as two P-N diodes, with the P-type part as the common part. In this embodiment, the N+ doped layer 210 is connected to the voltage level as indicated by Gate and the N+ doped layer 212 is connected to the ground voltage, as indicated by GND.

Remarkable, two parasitic capacitors 216 and 218 are created between the P-N junction between the N+ doped layer 210 and the P-type doped well (PW) 208, and between the N+ doped layer 212 and the P-type doped well (PW) 208. As noted, the two capacitors 216 and 218 are connected in series, so the capacitance is reduced. Since the parasitic capacitance is effectively reduced, the measurement deviation due to the parasitic capacitance can be effectively reduced.

Figure 4:
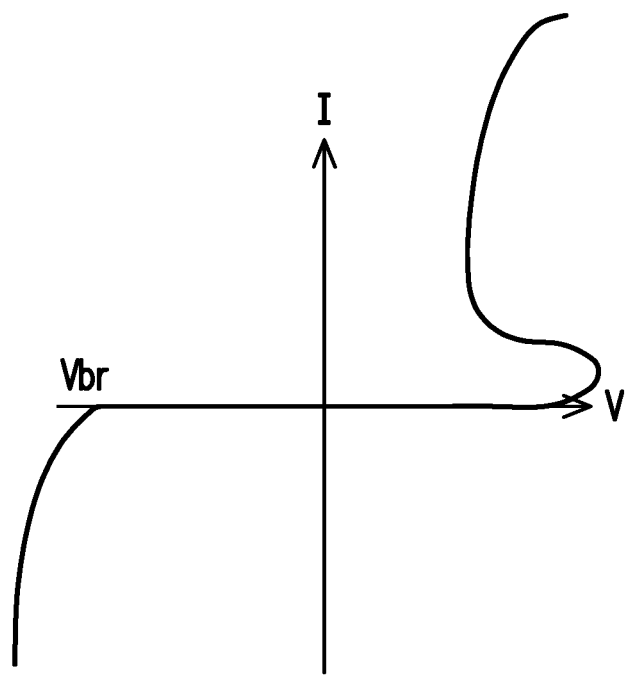
FIG. 4 is a drawing, schematically illustrating a I-V curve of the protection diode in FIG. 3, according to an embodiment of the invention.

Even further, the protection effect can also be modified. FIG. 4 is a drawing, schematically illustrating a I-V curve of the protection diode in FIG. 3, according to an embodiment of the invention. Referring to FIG. 4, when the protection device an also protect a positive unexpected voltage, in which a snake-back phenomenon in I-V curve would occur. The protection effect of the protection device of the invention is bi-direction. The protection device can endure the positive/negative voltage while the protection effect can still maintain.

Figure 5:
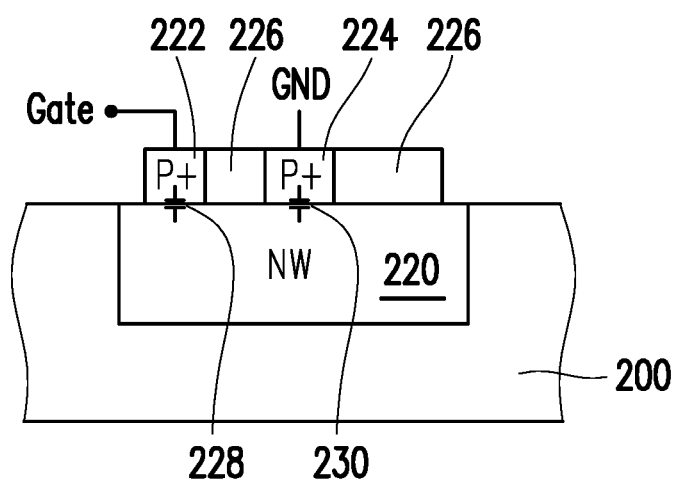
FIG. 5 is a drawing, schematically illustrating a cross-sectional view of a protection device, according to an embodiment of the invention.

FIG. 5 is a drawing, schematically illustrating a cross-sectional view of a protection device, according to an embodiment of the invention. Referring to FIG. 5, the protection device in the embodiment of FIG. 3 is an N-P-N structure. However, it can also be in P-N-P structure for protecting the device in other conductive type. The protection device in an embodiment includes the N-type doped well (NW) 220 in the substrate 200. Then, a P+ doped layer 222 and a P+ doped layer 224 are formed on the N-type doped well (NW) 220 and insulated by the insulating layer 226. As a result, the two diodes are connected in the path of the P+ doped layer 222, the N-type doped well (NW) 220, and the P+ doped layer 224. Further, the parasitic capacitor 228 and 230 are created at the two P-N junctions.

Figure 6:
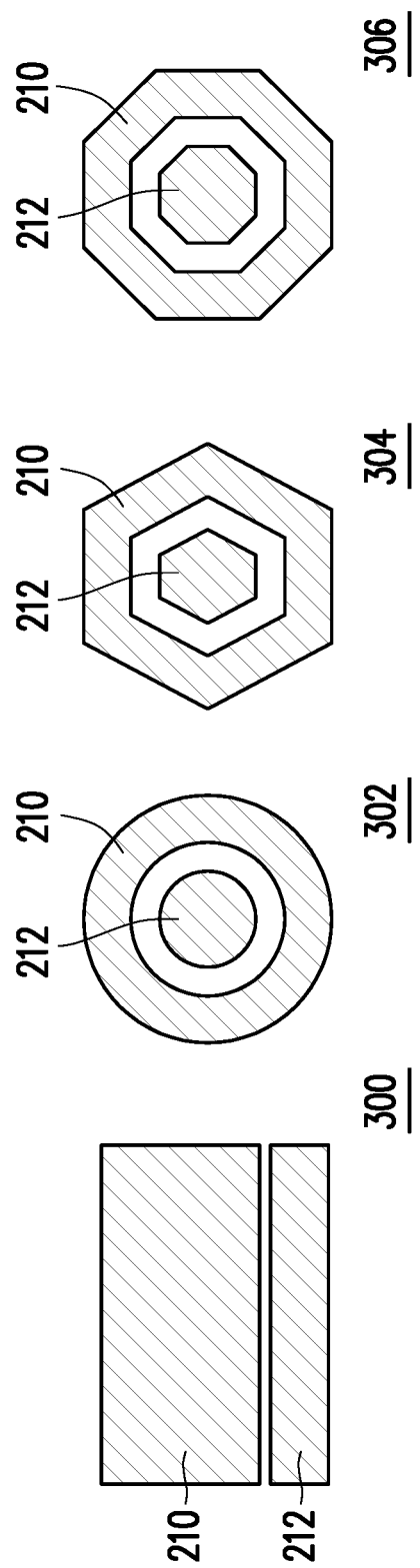
FIG. 6 is a drawing, schematically illustrating top views of a protection device, according to embodiments of the invention schematically illustrating.

FIG. 6 is a drawing, schematically illustrating top views of a protection device, according to embodiments of the invention schematically illustrating. Referring to FIG. 6, the geometric shape of the N+ doped layer 210 (P+ doped layer 222) and the N+ doped layer 212 (P+ doped layer 224) can be taken with specific limitation. However, several; embodiments are provided as the examples. Based on FIG. 3, N+ doped layer 210 and the N+ doped layer 212 in the protection device 300 may be two rectangles. The N+ doped layer 210 and the N+ doped layer 212 can also be circular in protection device 302 or polygonal in protection device 304 and 306. In the example, the protection device 304 is hexagonal and the protection device 306 is octagonal. Further, the sharp corners of the polygon may be rounded in smooth shape. As to the size, the N+ doped layer 210 as indicated by the Gate is larger than the N+ doped layer 212 as indicated by the GND. For example, the area ratio for the gate terminal to the ground terminal can be in a range of 2-120 without causing failure of the protection device.

Figure 7:
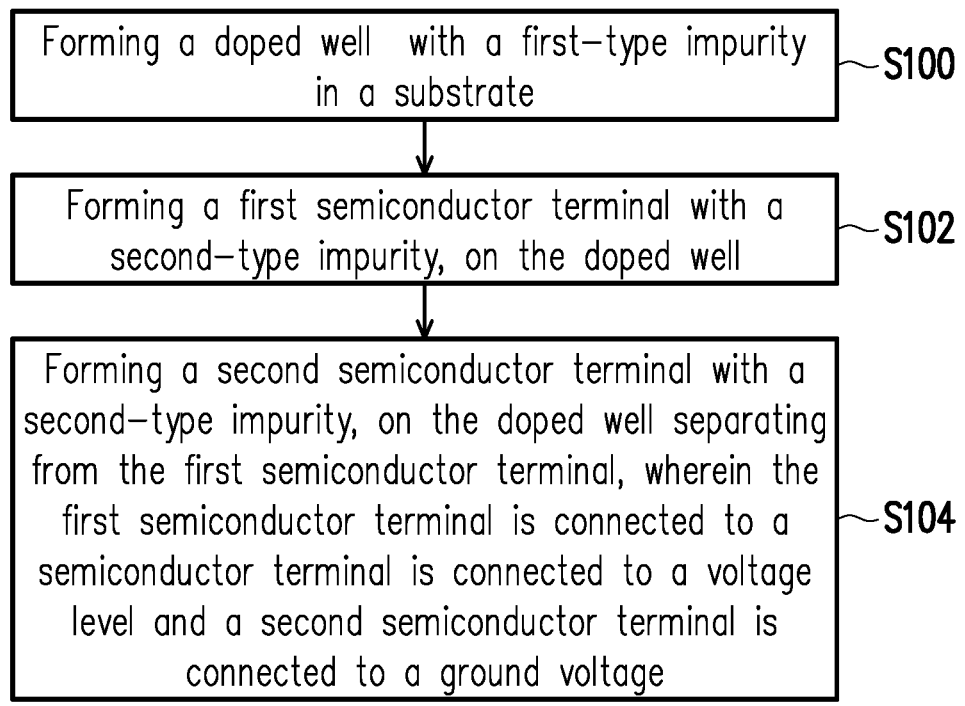
FIG. 7 is a drawing, schematically illustrating processing flow of the method for fabricating the protection device.

The invention also provides the method for fabricating the protection device. FIG. 7 is a drawing, schematically illustrating processing flow of the method for fabricating the protection device. Referring to FIG. 7, the method in step S100 includes forming a doped well with a first-type impurity in a substrate. Further, In step S102, a first semiconductor terminal with a second-type impurity is formed on the doped well. In step S104, a second semiconductor terminal with a second-type impurity is formed on the doped well separating from the first semiconductor terminal. The first semiconductor terminal is connected to a voltage level and a second semiconductor terminal is connected to a ground voltage.

The invention has proposed a protection device formed from N-P-N or P-N-P, which has smaller parasitic capacitance and cam protect the in bi-direction. The invention is suitable for connected to the signal pads under testing procedure with reduced capacitance effect to the semiconductor device under test.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for fabricating a protection device, comprising:
   forming a doped well with a first-type impurity in a substrate;
   forming a first semiconductor terminal with a second-type impurity, on the doped well; and
   forming a second semiconductor terminal with a second-type impurity, on the doped well separating from the first semiconductor terminal,
   wherein the first semiconductor terminal is connected to a voltage level and a second semiconductor terminal is connected to a ground voltage,
   wherein the first semiconductor terminal and the second semiconductor terminal are both entirely disposed above a top surface of the doped well, respectively, the top surface of the doped well is coplanar with a top surface of the substrate without conductive structure therebetween on the doped well in direct electric connection.

2. The method of claim 1, wherein the first-type impurity is P-type impurity and the second-type impurity is N-type impurity, or the first-type impurity is N-type impurity and the second-type impurity is P-type impurity.

3. The method of claim 1, wherein an area of the first semiconductor terminal is larger than an area of the second semiconductor terminal.

4. The method of claim 1, wherein the first semiconductor terminal and the second semiconductor terminal are a polygon shape with separation.

5. The method of claim 1, wherein the first semiconductor terminal surrounds the second semiconductor terminal.

6. The method of claim 1, wherein a first junction capacitor formed between the first semiconductor terminal and the doped well, and a second junction capacitor formed between the second semiconductor terminal and the doped well.

7. The method of claim 1, wherein the first junction capacitor is larger than the second junction capacitor.

8. The method of claim 1, wherein the first junction capacitor is connected to the second junction capacitor in series.

9. A method for fabricating a protection device, comprising:
- forming a doped well with a first-type impurity in a substrate;
- forming a first semiconductor terminal with a second-type impurity, on the doped well;
- forming a second semiconductor terminal with a second-type impurity, on the doped well separating from the first semiconductor terminal; and
- forming an insulating layer on the doped well to isolate the second semiconductor terminal from the first semiconductor terminal, wherein top and bottom surfaces of the insulating layer on the doped well is coplanar with respect to top and bottom surfaces of the second semiconductor terminal and the first semiconductor terminal, respectively,
- wherein the first semiconductor terminal is connected to a voltage level and a second semiconductor terminal is connected to a ground voltage.

10. The method of claim 9, wherein the first-type impurity is P-type impurity and the second-type impurity is N-type impurity, or the first-type impurity is N-type impurity and the second-type impurity is P-type impurity.

11. The method of claim 9, wherein an area of the first semiconductor terminal is larger than an area of the second semiconductor terminal.

12. The method of claim 9, wherein the first semiconductor terminal and the second semiconductor terminal are a polygon shape with separation.

13. The method of claim 9, wherein the first semiconductor terminal surrounds the second semiconductor terminal.

14. The method of claim 9, wherein a first junction capacitor formed between the first semiconductor terminal and the doped well, and a second junction capacitor formed between the second semiconductor terminal and the doped well.

15. The method of claim 9, wherein the first junction capacitor is larger than the second junction capacitor.

16. The method of claim 9, wherein the first junction capacitor is connected to the second junction capacitor in series.

* * * * *